United States Patent [19]
Tiller et al.

[11] Patent Number: 5,933,771
[45] Date of Patent: Aug. 3, 1999

[54] LOW VOLTAGE GAIN CONTROLLED MIXER

[75] Inventors: Samuel Alfred Tiller; George Khoury, both of Ottawa, Canada

[73] Assignee: Nortel Networks Corporation, Montreal, Canada

[21] Appl. No.: 08/879,771

[22] Filed: Jun. 20, 1997

[51] Int. Cl.[6] .............................. H04B 1/26; H03F 3/00
[52] U.S. Cl. .......................... 455/333; 455/323; 455/326; 330/254
[58] Field of Search .................................... 455/333, 326, 455/250.1, 323, 330, 254, 313; 327/355, 359, 113; 330/254, 252

[56] References Cited

U.S. PATENT DOCUMENTS

| | | | |
|---|---|---|---|
| 4,704,738 | 11/1987 | Graziadei et al. | 455/253 |
| 4,931,746 | 6/1990 | Trankle et al. | 330/254 |
| 5,233,311 | 8/1993 | Chevallier | 330/252 |
| 5,355,534 | 10/1994 | Kimura | 455/323 |
| 5,589,791 | 12/1996 | Gilbert | 327/359 |
| 5,809,410 | 7/1993 | Stuebing et al. | 455/333 |
| 5,874,857 | 3/1995 | Roth et al. | 330/254 |

FOREIGN PATENT DOCUMENTS

| | | |
|---|---|---|
| 0 634 835 | 1/1995 | European Pat. Off. |
| 2 239 752 | 7/1991 | United Kingdom. |

*Primary Examiner*—Reinhard J. Esenzope
*Assistant Examiner*—Duc Nguyen

[57] ABSTRACT

The functionality of a variable gain controlled amplifier and a tree mixer are combined to provide a variable gain controlled mixer. In constructing the combination, both the current-to-voltage conversion output stage of the mixer, and the voltage-to-current conversion input stage of the variable gain amplifier are removed. Both the variable gain stage and the mixing stage are connected in parallel to modify the input current. Other configurations are provided, including a single balanced mixer, and a folded mixer.

21 Claims, 10 Drawing Sheets

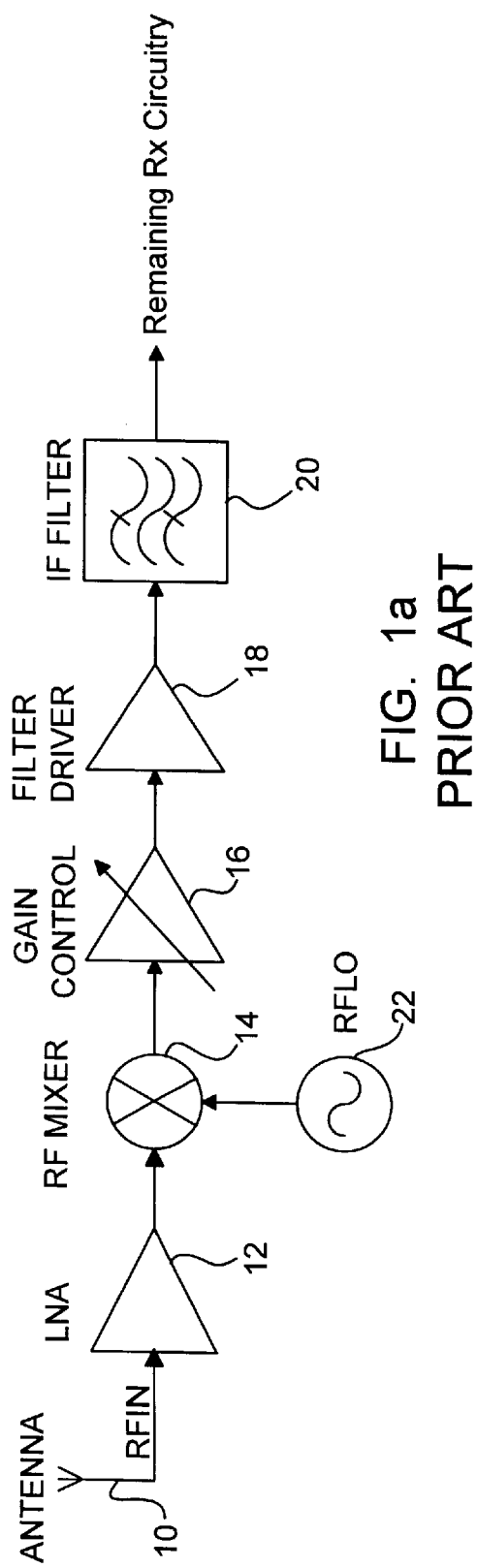
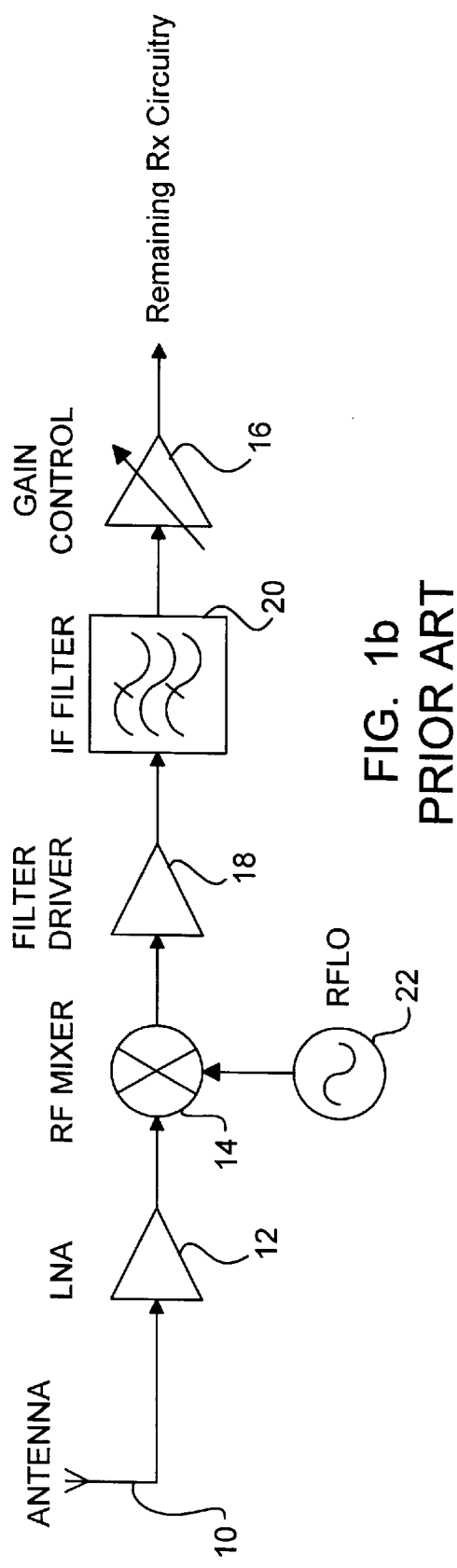
FIG. 1a PRIOR ART
FIG. 1b PRIOR ART

LOW VOLTAGE GAIN CONTROLLED MIXER

FIELD OF THE INVENTION

The invention relates to a low voltage gain controlled mixer.

BACKGROUND OF THE INVENTION

In many communications systems, specifically wireless networks, an information signal is modulated onto a higher frequency carrier before being transmitted. In these systems, there is often a need at the receiver for some form of frequency translation back to lower frequencies. A decision device is then used to recover the information.

In wireless systems in particular, there is a substantial amount of signal level variation at the receiver. Changes in the path loss, the distance from the transmitter, and other factors result in a wide range of signals which must be handled by the receiver. One of the most common methods of accommodating this high dynamic range requirement is with a variable gain element. This element (or elements), under the direction of some control circuitry, typically applies a variable gain to the received signal at some point in such a manner that the signal at the decision device is kept at a relatively constant amplitude.

Traditionally, the two functions of frequency translation and gain control have been separated into two distinct circuits. The frequency translation, a relatively simple process is usually done first with the more complex gain control being done at a lower intermediate frequency and often after a filtering stage to ease its implementation. There are several problems with this approach. The farther the gain control is from the receiver antenna, the higher the dynamic range requirements for all circuits before the gain control element including the input circuit of the gain control element itself. Thus there is an advantage to having the gain control function located close to the receive antenna. However, one of the biggest problems in the wireless arena involves receiving a small wanted signal in the presence of large out-of-band interferers. Since the filter stage mentioned above reduces the level of these interferers, it is easier to design the gain control function if it is located after the filter. As such, there is an advantage to having the gain control function located farther from the antenna. Thus the designer is faced with the decision to go with an implementation in which the gain control function is closer to the antenna which is more difficult to design and draws more power but eases the requirements of the rest of the circuitry or an implementation in which the gain control function is farther from the antenna after a filtering stage which is easier to design but places more burden on (i.e. increases the power consumption of) the preceding circuitry.

Gain controlled mixers have been implemented and/or proposed in the past but all previous implementations suffer from high noise and/or poor intermodulation performance (see for example Analog Devices, AD607 Low Power Mixer/AGC/RSSI 3 V Receiver IF Subsystem Datasheet, Rev O).

SUMMARY OF THE INVENTION

It is an object of the invention to obviate or mitigate one or more of the above identified disadvantages.

According to a first broad aspect, the invention provides a variable gain controlled mixer comprising: a mixer stage having differential mixing input terminals for receiving a mixing input signal, connected to a source of a main differential current, and having differential output terminals for producing a differential output signal, the output terminals also being connected across respective loads to a first supply terminal; two gain control transistors coupled between a second supply terminal and the source of the main differential current for receiving a gain control input signal; whereby the differential output signal is representative of the product of the main differential current, the mixing input signal, and the gain control input signal.

According to a second broad aspect, the invention provides a variable gain controlled mixer comprising: a mixer stage having differential mixing input terminals for receiving a mixing input signal, connected to a source of a main current, and having differential output terminals for producing a differential output signal, the output terminals also being connected across respective loads to a first supply terminal; a gain control transistor coupled between a second supply terminal and the source of the main current for receiving a gain control input signal; whereby the differential output signal is representative of the product of the main current, the mixing input signal, and the gain control input signal.

According to a third broad aspect, the invention provides a variable gain controlled mixer comprising: an input differential pair of transistors having emitters connected through a first current source to a negative supply terminal, and having collectors connected through respective second and third current sources to a positive supply terminal, and having input terminals for receiving a main differential input voltage across the bases of the input differential pair of transistors; a mixer stage comprising first and second differential pairs of transistors of complementary type to the input differential pair, the emitters of each of the first and second differential pairs being connected to a respective collector of the input differential pair, the collectors of the first and second differential pairs being cross-connected with each other, one transistor of each of the first and second differential pairs being coupled to a respective terminal of a differential output terminal and through a load to the negative supply terminal; first and second gain control transistors of complementary type to the input differential pair, each connected between the negative supply terminal and the emitters of a respective one of the first and second differential pairs, and having bases for receiving a gain control voltage; whereby the differential output signal is representative of the product of the main differential input voltage, the mixing input signal, and the gain control input signal.

According to a fourth broad aspect, the invention provides a variable gain controlled mixer comprising: an input differential pair of transistors having emitters connected through a first current source to a negative supply terminal, and having collectors connected through respective second and third current sources to a positive supply terminal, and having input terminals for receiving a main differential input voltage across the bases of the input differential pair of transistors; a mixer stage comprising first and second differential pairs of transistors of complementary type to the input differential pair, the emitters of each of the first and second differential pairs being connected to a respective collector of the input differential pair, the collectors of the first and second differential pairs being cross-connected with each other, one transistor of each of the first and second differential pairs being coupled to a respective terminal of a differential output terminal and through a load to the negative supply terminal; first and second gain control transistors of the same type as the input differential pair, each connected between the positive supply terminal and a respective collector of a transistor of the input differential pair, and having bases for receiving a gain control voltage; whereby the differential output signal is representative of the product of the main differential input voltage signal, the mixing input signal, and the gain control input signal.

Advantageously, by integrating gain control functionality with the mixer, the benefits of locating the gain control function near the antenna are realized without the associated penalties. This implementation does not affect the dynamic range of the mixer itself and since it operates on signals already generated inside the mixer, there is no extra supply current required.

BRIEF DESCRIPTION OF THE DRAWINGS

Preferred embodiments of the invention will now be described with reference to the attached drawings in which:

FIG. 1a is a block diagram of a typical receiver in which a gain control element is located close to the antenna;

FIG. 1b is a block diagram of a typical receiver in which a gain control element is located after an IF filter;

DETAILED DESCRIPTION OF THE PREFERRED EMBODIMENTS

Figure 2:
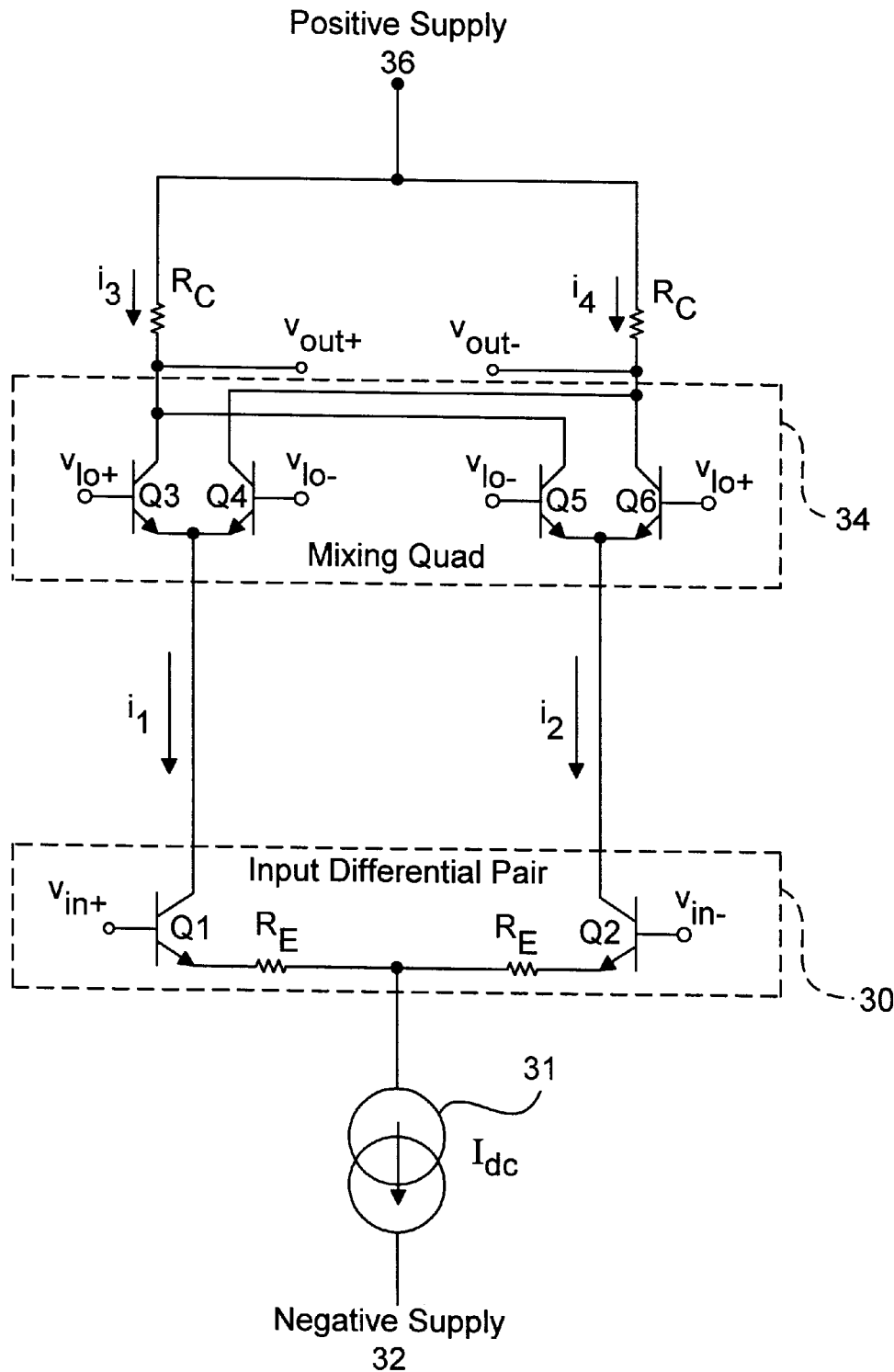
FIG. 2 is a schematic of a conventional basic tree mixer.

Referring firstly to FIG. 1a, an example of a conventional receiver is shown consisting of, connected together in sequence, an antenna 10 through which is received an RF signal RFIN, an input amplifier 12 such as an LNA (low noise amplifier), an RF mixer 14, a gain control element 16, a filter driver 18, an IF filter 20, and additional receiver circuitry (not shown). An RFLO (RF local oscillator) 22 is connected to the RF mixer 14. In this example, the gain control element 16 is located before the IF filter 20, and as such, is difficult to design, as referred to above.

Referring now to FIG. 1b, another example of a conventional receiver is shown consisting of, connected together in sequence, an antenna 10 through which is received an RF signal RFIN, an input amplifier 12 such as an LNA, an RF mixer 14 having an RFLO 22, a filter driver 18, an IF filter 20, a gain control element 16, and additional receiver circuitry (not shown). In this example, the gain control element 16 is located after the IF filter 20, and as such, all the elements located before the gain control element 16 including the IF filter 20 must be designed to handle signals having a large dynamic range, as referred to above.

Referring now to FIG. 2, a conventional basic tree mixer will be described. This mixer might be used as the RF mixer 14 in FIGS. 1a and 1b for example. The tree mixer has an input stage which in the illustrated example is an input differential pair 30 consisting of transistors Q1, Q2 whose emitters are connected to a negative power supply 32 through respective degeneration resistors $R_E$ and a biasing current source 31. The tree mixer has a mixer stage which in the illustrated embodiment is a mixing transistor quad 34 consisting of transistors Q3, Q4, Q5, Q6 configured as a pair of differential pairs Q3, Q4 and Q5, Q6. The emitters of transistors Q3, Q4 are connected together and to the collector of transistor Q1. Similarly, the emitters of transistors Q5, Q6 are connected together and to the collector of transistor Q2. The collectors of transistors Q3, Q6 are connected across respective load resistors $R_C$ to a positive power supply 36. In addition, the collectors of the two differential pairs are cross-connected with the collector of transistor Q3 connected to the collector of transistor Q5, and the collector of transistor Q4 connected to the collector of transistor Q6.

A main differential input voltage signal ($v_{in-}$, $v_{in+}$) is connected to the input differential pair 30 at the bases of transistors Q1, Q2. The input differential pair 30 converts this voltage into a main differential current ($i_1$, $i_2$). Assuming the input voltage is a sinusoid having frequency $\omega_R$ and amplitude $A_{in}$, the currents $i_1$, $i_2$ satisfy $$i_1 - i_2 = A_{in}\frac{\cos(\omega_R t)}{2R_E}.$$

The different current may be expressed as $(i_1, i_2) = (I_{dc}/2 + i_{sig}, I_{dc}/2 - i_{sig})$ where $I_{dc}$ is the biasing current provided by the current source 31, and $i_{sig}$ represents the information signal. A mixing input signal (also referred to as a LO (local oscillator) signal consisting of a differential mixing voltage signal) ($v_{1o-}$, $v_{1o+}$) is connected to differential mixing input terminals which are located across the bases of transistors Q3, Q4 and also across the bases of transistors Q5, Q6. It is assumed that the bases of the upper transistor quad 34 are driven so hard by the LO inputs that the current transfer function of the quad can be approximated to alternate multiplication by +1 and −1 at the LO frequency $\omega_L$. This alternate multiplication by +1 and −1 can be expressed as a Fourier series as follows:

$$f_L(t) = \frac{4}{\pi}\sum_{n=1,3,5...}\frac{1}{n}\sin(n\omega_L t)$$

A differential output current ($i_3$, $i_4$) results which is characterized by the input differential current ($i_1, i_2$) multiplied by the current transfer function identified above. This yields $$i_3 - i_4 = \frac{A_{in}}{2R_E}\frac{4}{\pi}\cos(\omega_R t)\left[\sin(\omega_L t) + \frac{1}{3}\sin(3\omega_L t) + ...\right]$$

This differential current can then be applied to a load represented by the resistors $R_C$ to produce a differential voltage ($v_{out-}$, $V_{out+}$) at differential output terminals. Conventionally, the output from the mixer is filtered with a low-pass or bandpass filter (not shown) with the result that the output voltage can be characterized by one of the two components of $$v_{out} = \frac{A_{in}R_c}{R_E} \cdot \frac{2}{\pi} [\sin((\omega_L + \omega_R)t) + \sin((\omega_L - \omega_R)t)]$$

where the remaining frequency components have been filtered out. One can see from this expression that the input signal ($v_{in-}$, $v_{in+}$) and the LO signal have been mixed as required.

Figure 3:
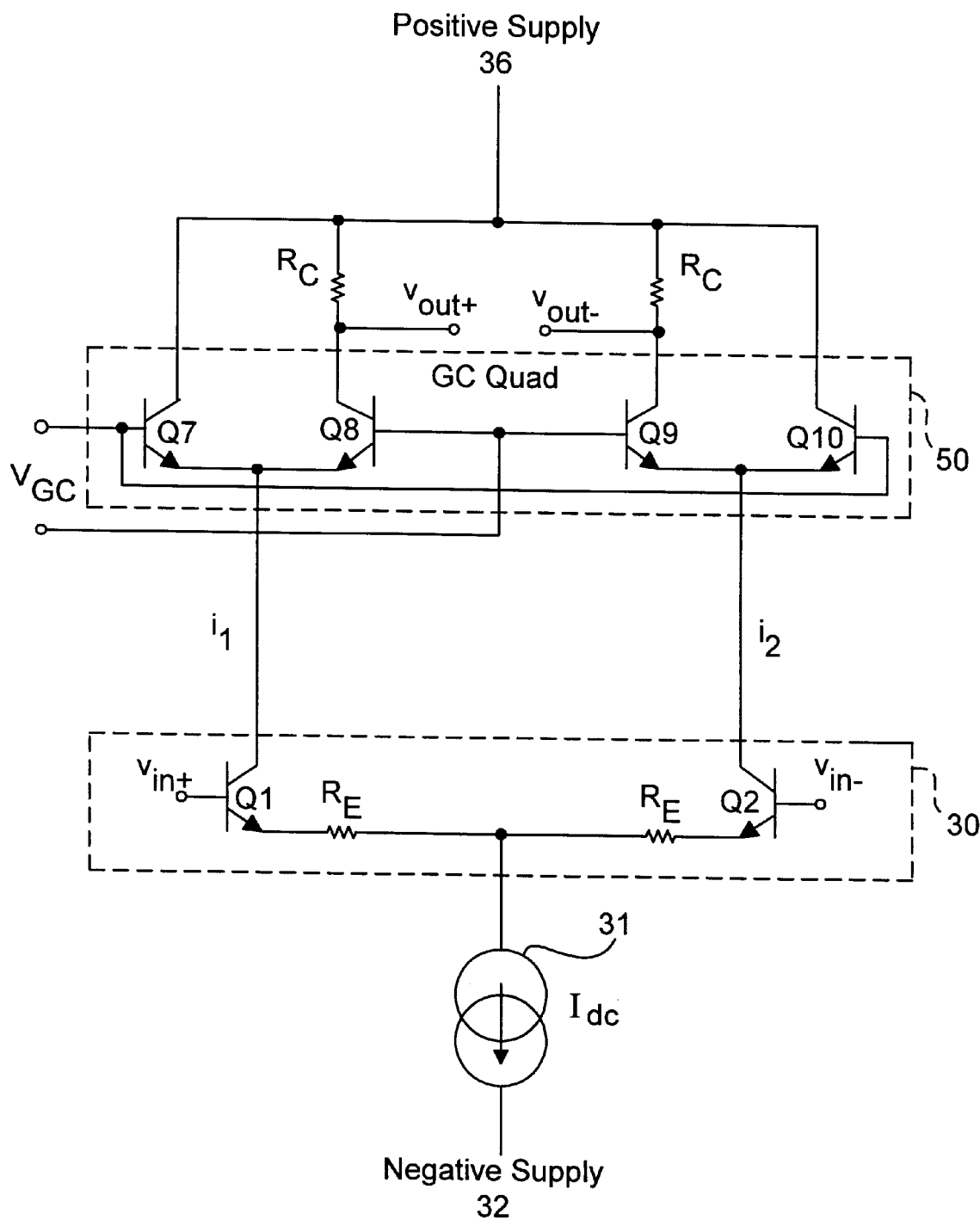
FIG. 3 is a schematic of a conventional variable gain controlled amplifier.

Referring now to FIG. 3, a conventional variable gain controlled amplifier will be described. This might be the gain control element 16 of FIGS. 1a and 1b for example. As was the case with the basic tree mixer described above, the variable gain controlled amplifier has an input stage which in the illustrated example is differential pair 30 consisting of a pair of transistors Q1, Q2 having emitters connected through respective resistances $R_E$ and a biasing current source 31 to a negative power supply 32. There is also a gain control stage which in the illustrated example is an upper GC (gain control) transistor quad 50 consisting of transistors Q7, Q8, Q9, Q10 connected as two differential pairs Q7, Q8 and Q9, Q10. The emitters of transistors Q7, Q8 are connected together and to the collector of transistor Q1. Similarly, the emitters of transistors Q9, Q10 are connected together and to the collector of transistor Q2. The collectors of transistors Q8, Q9 are connected across respective load resistors $R_C$ to a positive power supply 36 while the collectors of transistors Q7, Q10 are connected directly to the positive power supply.

As with the tree mixer of FIG. 2, the input differential pair converts a main differential voltage input signal ($v_{in-}$, $v_{in+}$) into a main differential current ($i_1$, $i_2$) The amount of signal current($i_1$, $i_2$) directed to the load $R_C$ is controlled by the base bias on the upper transistor quad 50. Transistors Q7 and Q10 are grounding transistors which, when turned off, cause all of the signal current ($i_1$, $i_2$) to be directed into the load $R_C$. Transistors Q8 and Q9, when turned off, cause all of the signal current to pass directly to the positive supply (ac ground). A gain control input signal consisting of GC control voltage $V_{GC}$ is applied to the bases of the transistors of the upper transistor quad 50. A smooth transition in gain is obtained by varying $V_{GC}$ thereby controlling the amount of signal current that is diverted into the ac ground. The voltage gain $A_v$ produced by the variable gain controlled amplifier may be expressed by $$A_v = \frac{R_C}{R_E} \frac{1}{1 + \exp(V_{GC}/V_T)}$$

where
$V_T$=KT/q; the "thermal voltage"
K=Boltzmann's constant=$1.38 \times 10^{-23}$ Joules/Kelvin
T=the absolute temperature in Kelvins
q=the magnitude of electronic charges=$1.602 \times 10^{-19}$ coulomb In conventional applications, the mixer of FIG. 2 and the gain control circuit of FIG. 3 may be connected together, for example as shown in FIG. 1a where the RF mixer 14 is connected to the gain control element 16. Alternatively, there may be elements interposed between the mixer and the gain control circuit, for example as shown in FIG. 1b where the filter driver 18 and the IF filter 20 are located between the mixer 14 and the gain control element 16.

The mixer performs a voltage-to-current conversion at its input and a current-to-voltage conversion at its output. Similarly, the gain control element performs a voltage-to-current conversion at its input and a current-to-voltage conversion at its output. When the above-described mixer is connected directly to the above-described gain control circuit, there is a redundant set of conversions which are taking place. In particular, the current output of the mixer is converted to a voltage which is then converted back into a current at the input to the gain control circuit. The gain controlled mixer according to the invention combines the functionality of the mixer of FIG. 2 with the gain control circuit of FIG. 3, and in so doing reduces the overall distortion and eliminates the redundant set of conversions and the associated circuitry.

Figure 4:
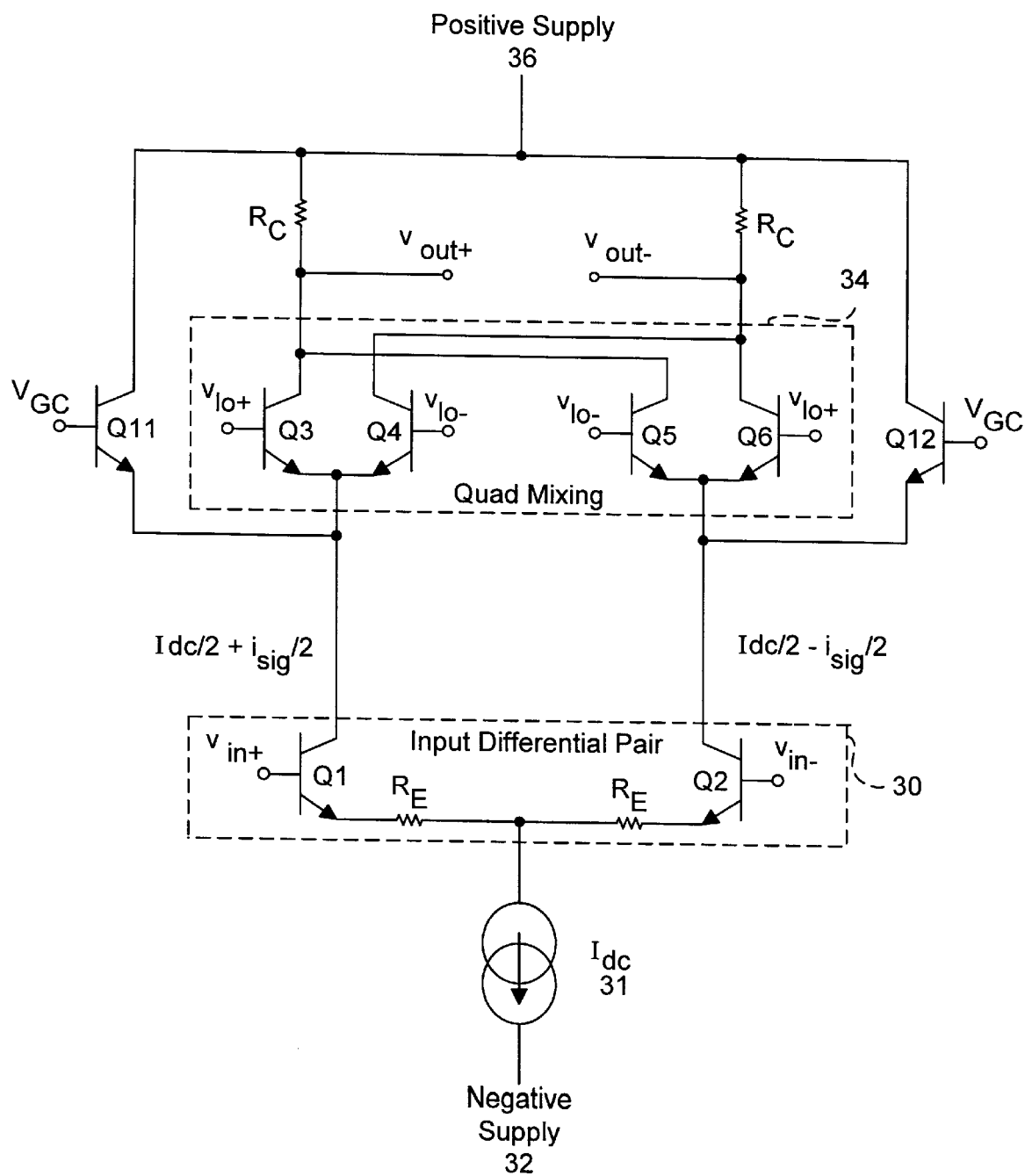
FIG. 4 is a schematic of a variable gain controlled tree mixer according to an embodiment of the invention.

Referring now to FIG. 4, a basic gain controlled tree mixer according to an embodiment of the invention will be described. The gain controlled mixer includes all of the components of the basic tree mixer of FIG. 2, and these components are identically labelled. In addition, two gain control transistors Q11, Q12 are provided. The collectors of the gain control transistors Q11, Q12 are connected to the positive supply 36, and the emitters are connected to the emitters of the mixing transistor quad 34.

Although it is not necessary in practice, it is useful at this time to assume that the mixing input signal ($v_{1o-}$, $v_{1o+}$) referred to earlier is a true square wave with peak amplitude $V_{LO}$. This has no effect on the above equations but it does allow for a simpler explanation of the new gain controlled mixer circuit.

As explained above, only one of each pair of transistors in the mixing transistor quad 34, namely one from each pair with the highest base voltage, is active at a given time. The other device can be ignored for the purposes of explanation. With the square wave local oscillator drive signal approximation as described above, the base voltage on the active device is always $V_{LO}$.

Figure 5A:
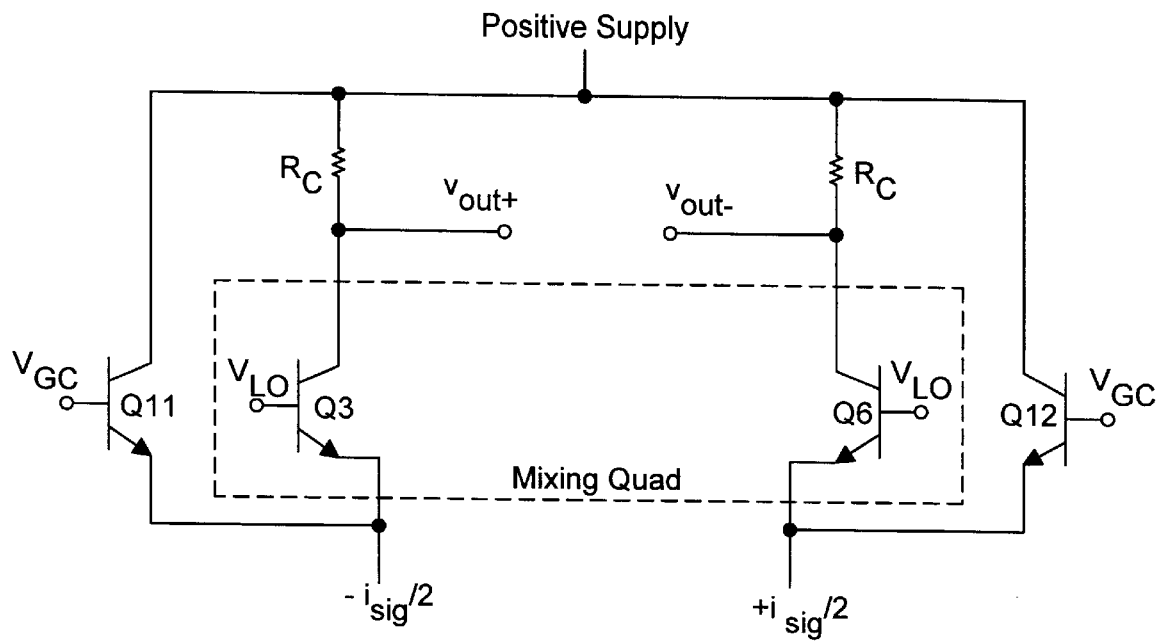
FIGS. 5a and 5b show the components of the variable gain controlled mixer of FIG. 4 which are active for positive and negative half clock cycles respectively.
Figure 5B:
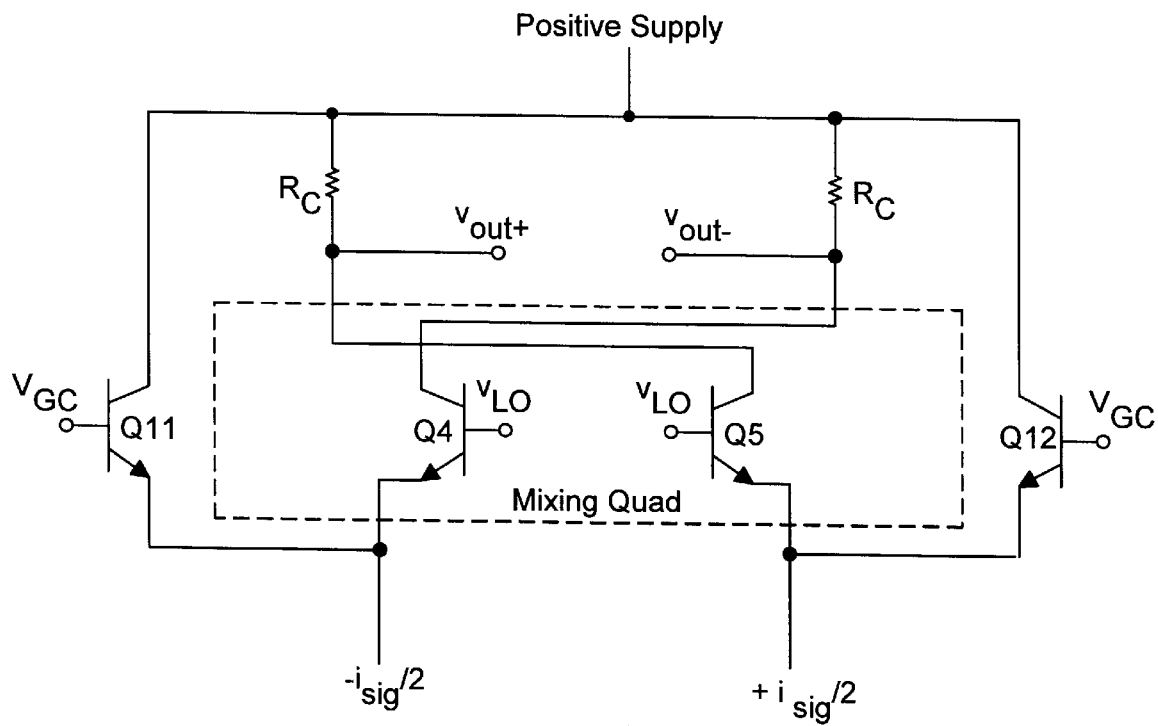

FIG. 5 shows the active devices for this embodiment of the invention during both positive and negative half cycles of the local oscillator signal with the inactive devices removed for clarity. In FIG. 5a, the devices which are active during the positive half cycle of the local oscillator signal are shown. These include Q3 and Q6 from the mixing quad, and the gain control transistors Q11, Q12. In FIG. 5b, the devices which are active during the negative half cycle of the local oscillator signal are shown. These include Q4 and Q5 from the mixing quad and the gain control transistors Q11 and Q12. As can be seen from FIGS. 5a, 5b, each active mixing transistor and a respective gain control transistor form a differential pair. In FIG. 5a, the differential pairs consist of Q3, Q11 and Q6, Q12, while in FIG. 5b the differential pairs consist of Q4, Q11 and Q5, Q12. Since the base voltage on the mixing transistors is fixed, (for the period they are active), the voltage on the bases of the gain control transistors Q11, Q12 can be varied to adjust the amount of signal current which reaches the output. This results in the following modified output current equation:

$$i_{out} = |i_{sig}| \left[ \frac{1}{1 + \exp((V_{GC} - V_{LO})/V_T)} \right] \frac{4}{\pi} \cos(\omega_R t) \left[ \sin(\omega_L t) + \frac{1}{3}\sin(3\omega_t) + \ldots \right]$$

Typically, this output current would be applied to a load such as a load resistance $R_C$ and either low pass or bandpass filtered to generate an output voltage. After filtering, only one of the two products in the following equation remain:

$$v_{out} = |i_{sig}|R_c \frac{2}{\pi} \left[ \frac{1}{1 + \exp((V_{GC} - V_{LO})/V_T)} \right] \sin[((\omega_L + \omega_R)t) + \sin((\omega_L - \omega_R)t)].$$

Since the GC transistors Q11, Q12 are effectively out of the circuit at maximum gain, the noise figure of the mixer is unaffected. It is at or around maximum gain where the noise figure is most critical.

Also, since the GC transistors Q11, Q12 merely divert the signal and bias current, there is very little effect on the linearity of the mixer. The active mixing quad transistors and the GC transistors behave very similarly to the differential pair in the original mixer.

Finally, because the gain control elements are added in parallel to existing devices, the minimum transistor stack-up remains at two (assuming the current source is replaced by a resistor). This translates to a minimum supply voltage on the order of 1.5 to 2 V.

Several variation and enhancements are possible.

Figure 6:
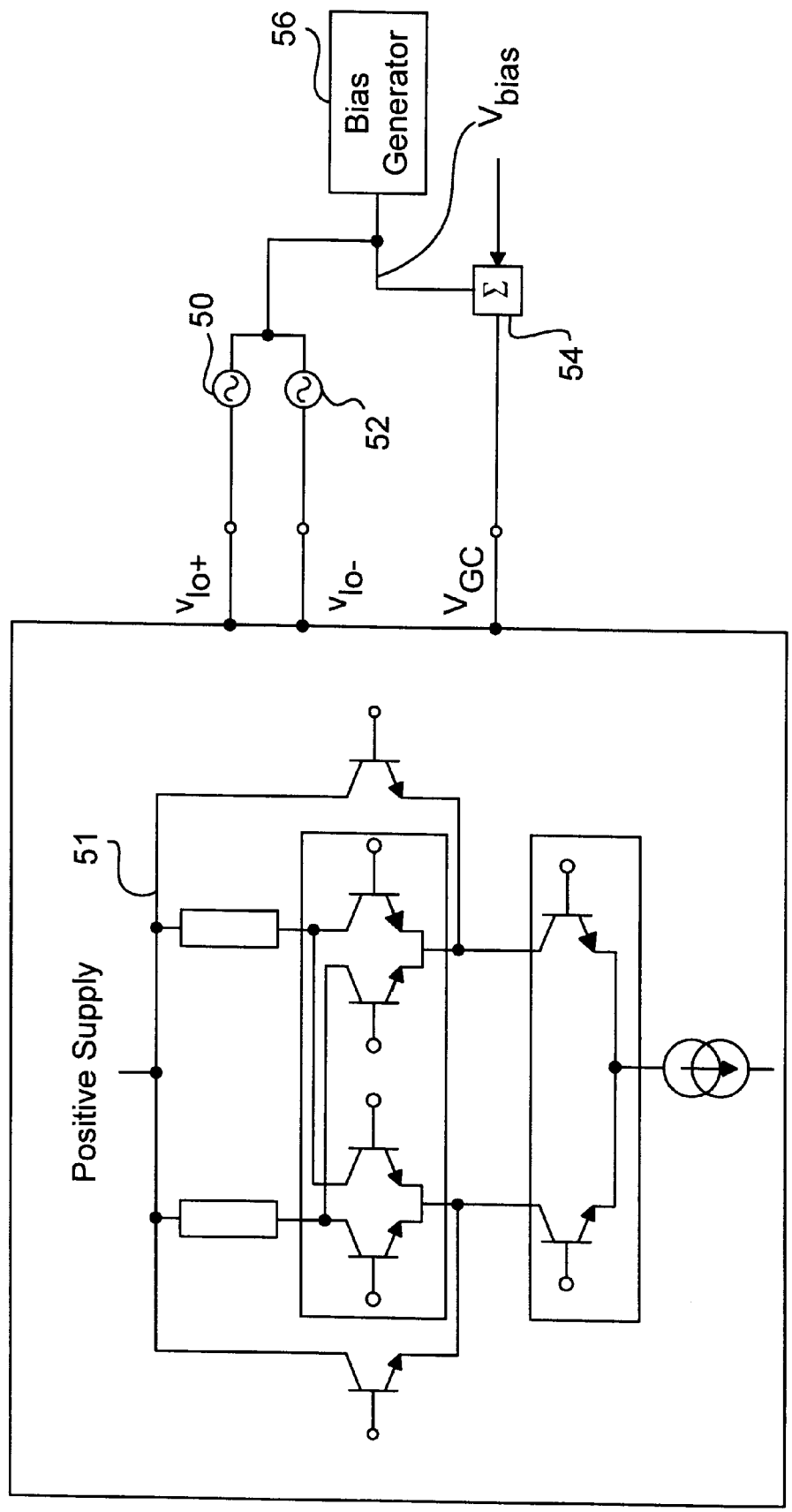
FIG. 6 is a schematic of a variable gain controlled mixer according to another embodiment of the invention in which common bias is employed.

In the most basic form of the gain controlled mixer as shown in FIG. 4, the conversion gain of the circuit is sensitive to the dc difference between the GC bases and the upper quad bases. This could be a real problem over temperature, for example. Using a common bias generator and summing the control signal with the common bias would remove much of this variation. An embodiment shown in FIG. 6 is a variation in which a common bias generator for the mixing quad and the GC transistors is employed. In addition to the functionality of the FIG. 4 embodiment which is shown inside box 51, this figure includes local oscillators 50, 52, an adder 54 and a bias generator 56. The local oscillators 50, 52 generate the differential mixing signal ($v_{1o-}$, $v_{1o+}$) which is connected to the mixer as in FIG. 4 although these connections are not shown in FIG. 6 to reduce clutter. The output of the adder 54 is the gain control voltage VGC and is connected to the gain control terminals although these connections are again not shown to reduce clutter.

In use, the bias generator 56 produces a common bias signal $V_{bias}$ which is applied both the mixing quad transistors and the gain control transistors. To achieve this, the bias signal $V_{bias}$ produced by the bias generator 56 is added to the local oscillator signals produced by oscillators 50, 52 so as to produce a differential mixing signal ($v_{1o-}$,$v_{1o+}$) having a dc value of $V_{bias}$. $V_{bias}$ is also added to an input control voltage $V_{ctrl}$ to produce $V_{GC}$. If there is no $V_{ctrl}$, the common bias generator 56 ensures that all six upper transistors (the mixing quad transistors and the gain control pair of transistors) have the same bias voltage. The effect of this is to offset any $V_{ctrl}$ by the nominal bias level. Over temperature, the bias from the common bias generator will vary but since it is applied to both the differential mixing signal and the gain control signals, the difference between the gain control base voltage and the active device base voltage remains constant, and therefore the gain remains constant.

Figure 7:
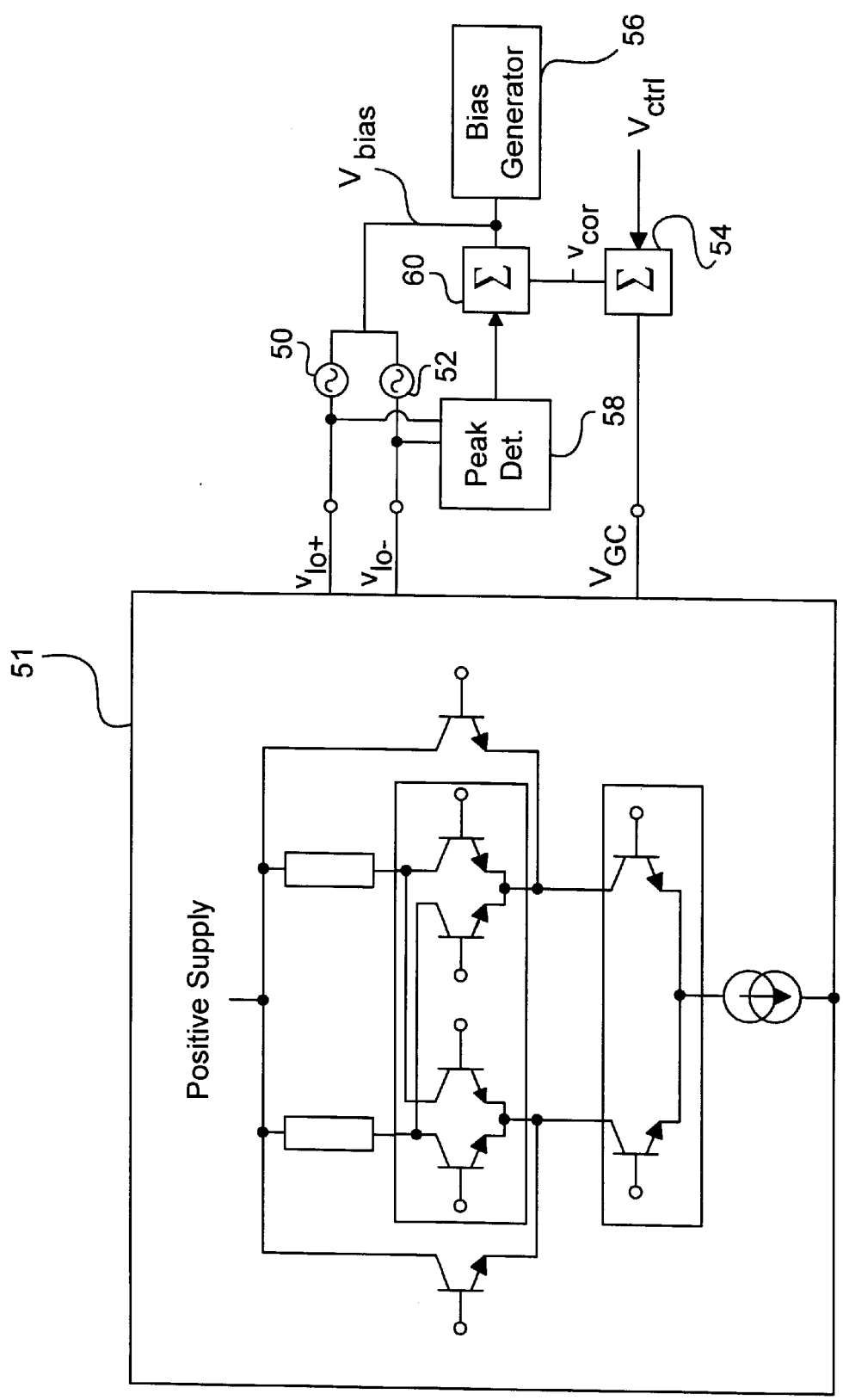
FIG. 7 is a schematic of a variable gain controlled mixer according to another embodiment of the invention in which common bias and LO peak detection are employed.

Another source of variation in the performance of the basic gain control mixer of FIG. 4 exists due to variation in the local oscillator level. In the gain control region, the mixing quad transistors are not handling one hundred per cent of the signal current. The amount of signal they modulate, and hence the conversion gain, is related to the relative levels of the peak LO voltage ($V_{LO}$) and the dc voltage at the gain control transistor bases. If the LO level varies with temperature or time (very common), the gain control curve will also vary. FIG. 7 shows one method of avoiding this by extending the common bias circuit of FIG. 6 to include a peak LO level detector 58 connected to detect the peak LO voltage and add (through adder 60) this voltage to the signal $V_{bias}$ produced by the bias generator circuit 56 to produce a corrected bias voltage $V_{cor}$. The nominal gain control base bias is now a function of the LO level as well as the upper quad dc bias (which equals $V_{bias}$). As $V_{LO}$ increases, the nominal bias point increases such that the internal control voltage difference $V_{GC}$-$V_{LO}$ remains constant. This can be seen from the following:

$$V_{GC} = V_{ctrl} + V_{cor}$$
$$= V_{ctrl} + V_{bias} + V_{LO}$$

where $V_{bias}$ is the bias voltage generated by the bias generator 56. The gain is set by the voltage difference $$\Delta V = (V_{GC} - V_{LO})$$
$$= (V_{ctrl} + V_{bias} + V_{LO}) - V_{LO}$$
$$= V_{ctrl} + V_{bias}.$$

From the last equation, it can be seen that any variation in the voltage difference ΔV due to $V_{LO}$ has been effectively eliminated.

Figure 8:
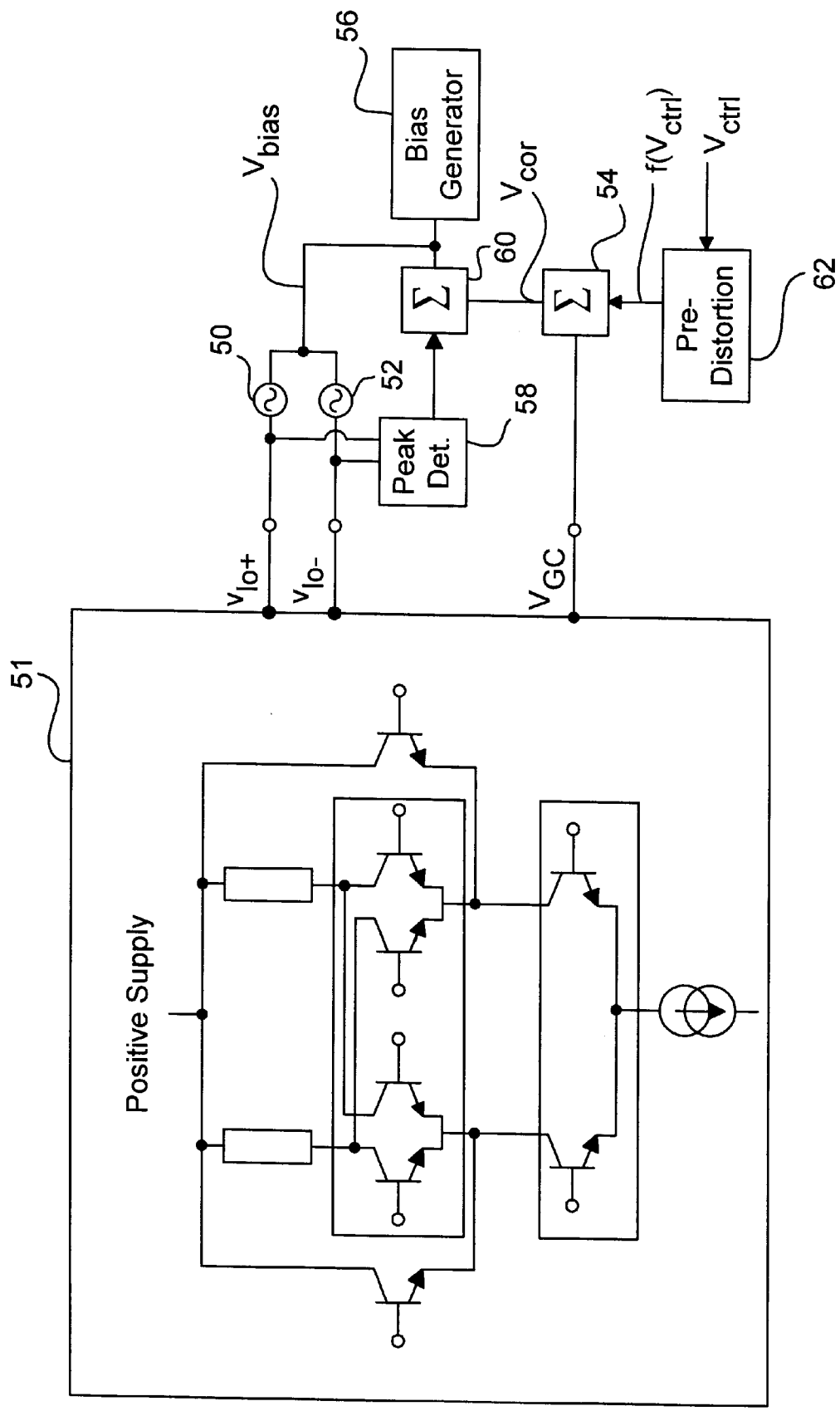
FIG. 8 is a schematic of a variable gain controlled mixer according to another embodiment of the invention in which common bias, LO peak detection and control voltage predistortion are employed.

In the basic gain control mixer of FIG. 4, the basic gain control voltage vs. conversion gain is an exponential function due to the nature of current ratioing in a BJT differential pair style gain control element. The basic ΔV vs. gain equation satisfies Gain 1 (1+exp(ΔV)) where ΔV=($V_{GC}$-$V_{LO}$). For some applications, the exponential gain decay is not desirable and a more linear characteristic is required. It is possible to linearize this function by adding a predistortion block 62 in series with the control signal as shown in FIG. 8, which is the same as FIG. 7 with the exception of the added predistortion block 62. With the added predistortion block, it is the voltage f($V_{ctrl}$) which is input to the adder 54 rather than $V_{ctrl}$. The basic $V_{ctrl}$ vs. Gain equation satisfies
 Gain 1/(1+exp (f(ΔV))), or
 Gain 1/(1+exp (f($V_{ctrl}$))), or
where f($V_{ctrl}$) represents the predistortion function applied to the control voltage $V_{ctrl}$ by the predistortion block 62, and can be selected such that the Gain vs. $V_{ctrl}$ function is linear rather than exponential.

Figure 9:
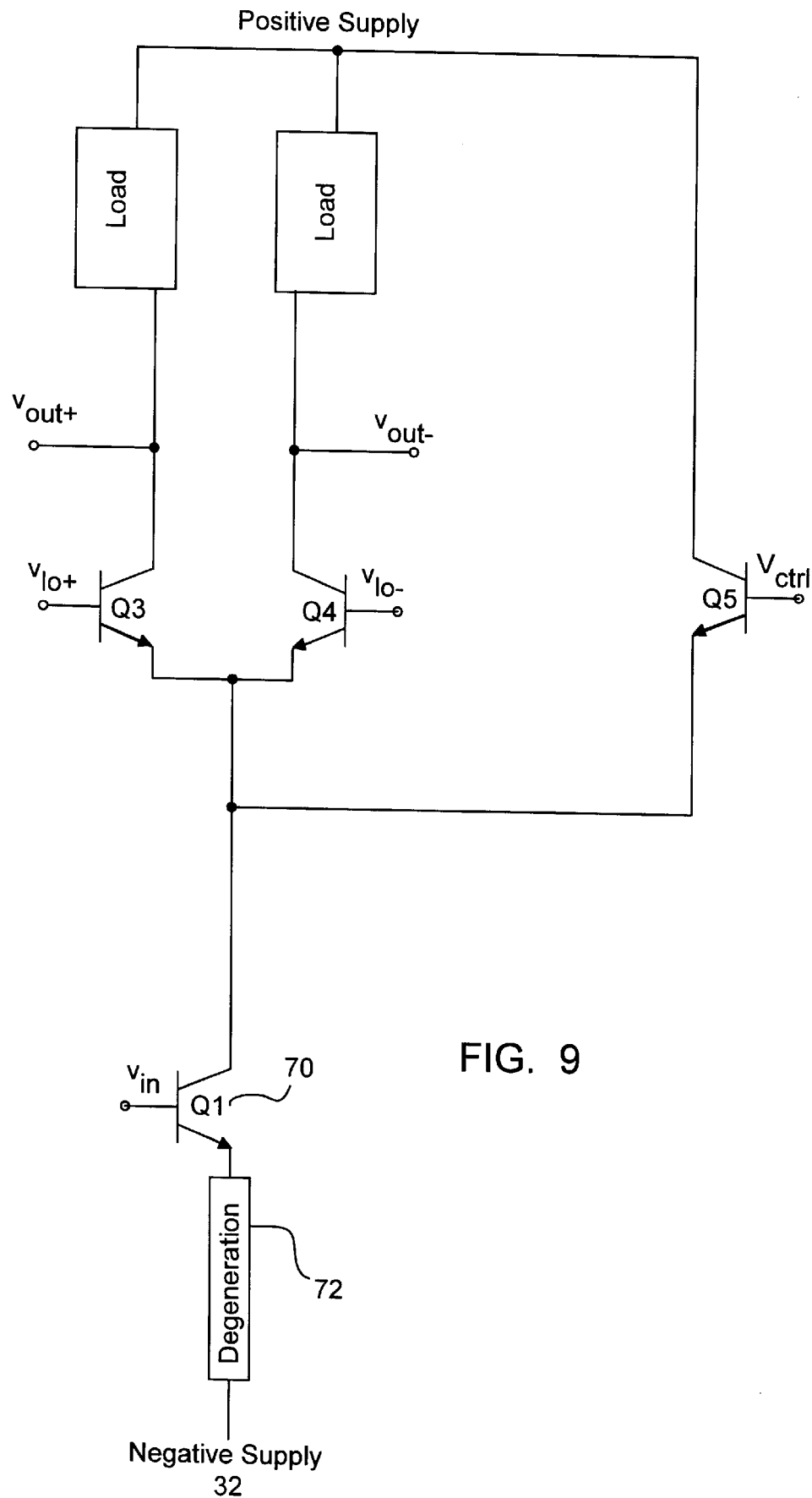
FIG. 9 is a schematic of a variable gain controlled mixer according to an embodiment of the invention with a single ended input.
Figure 10:
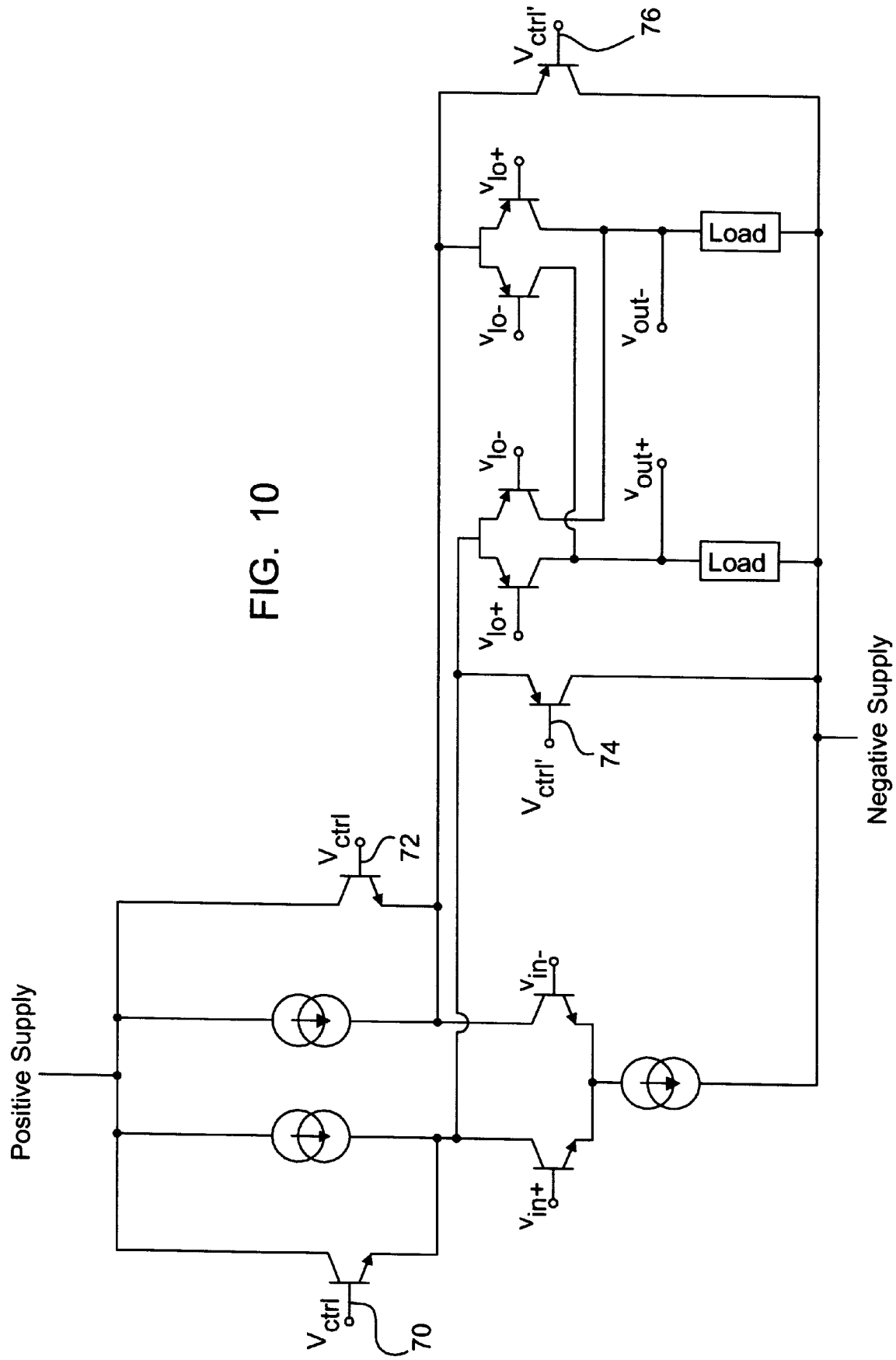
FIG. 10 is a schematic of a folded variable gain controlled mixer.

The preceding discussions have all centered around the double balanced tree mixer. However, the general technique we have described for adding gain control is equally applicable to many other variants on this type of mixer. Adaptations of two of the most common variants, the single balanced mixer and folded mixer, are shown in FIG. 9 and FIG. 10 respectively. In the FIG. 9 embodiment, a degeneration impedance 72 is connected between a negative supply 32 and an input transistor 70. Note in FIG. 10 that with a folded mixer, the gain control can be performed either by the NPN transistors 70, 72 to the positive supply and controlled by $V_{ctrl}$ or by the PNP transistors 74, 76 to the negative supply and controlled by $V_{ctrl}$. All four transistors 70, 72, 74, 76 are shown in a single figure, but only two of these would be used in a given implementation.

Numerous modifications and variations of the present invention are possible in light of the above teachings. It is therefore to be understood that within the scope of the appended claims, the invention may be practised otherwise than as specifically described herein.

Note that although the motivation for this work was a receiver design problem, this circuit also provides power savings to transmitters or any other circuits requiring frequency translation and gain control.

In the illustrated embodiments, BJTs (bipolar junction transistors) have been used, but it is to be understood that the invention could also be realized with other technologies, for example, MOSFETS (metal oxide semiconductor field effect transistors).

In the described embodiments, the figures and equations presented employ resistors for collector loads ($R_C$) and emitter degeneration ($R_E$). The invention is not limited to the use of resistors in these places. The variable gain mixing amplifiers according to the invention will work equally well for complex impedances in place of $R_C$ and $R_E$.

In the folded mixer embodiment of FIG. 10, parallel transistor devices 74, 76 may be employed to shunt current to the negative rail, or parallel device 70, 72 may be shunt current to the positive rail. Both of these options exist for the other embodiments as well although only the positive rail options are illustrated. In practice, it us much easier to shunt the current to the same supply as the supply to which the mixing quad output is connected. When the gain control transistors are connected to the opposite supply to the mixing stage transistors, the gain control transistors must be of complementary type.

The embodiments of the invention in which an exclusive property or privilege is claimed are defined as follows:

1. A variable gain controlled mixer comprising:
    a mixer stage having differential mixing input terminals for receiving a mixing input signal, connected to a source of a main differential current, and having differential output terminals for producing a differential output signal, the output terminals also being connected across respective loads to a first supply terminal;
    two gain control transistors coupled between a second supply terminal and the source of the main differential current for receiving a gain control input signal;
    whereby the differential output signal is representative of the product of the main differential current, the mixing input signal, and the gain control input signal.

2. A variable gain controlled mixer according to claim 1 wherein the first supply terminal and the second supply terminal are one and the same positive supply terminal and the mixer stage is comprised of NPN transistors, and the gain control transistors are NPN transistors.

3. A variable gain controlled mixer according to claim 2 further comprising an input stage for converting a main input voltage signal into the main differential current.

4. A variable gain controlled mixer according to claim 3 wherein the main input voltage signal is a main differential input signal, and the input stage comprises a first differential pair of bipolar transistors having a current source coupled to their emitters and first input terminals coupled to their bases for supplying the main differential input signal thereto;
    the mixer stage comprises two second differential pairs of bipolar transistors having second input terminals coupled to their bases for supplying the mixing input signal to each pair of the two second differential pairs of transistors, the transistors of each pair of the two second differential pairs having emitters coupled to a respective transistor of the first differential pair, and the transistors of the two second differential pairs having collectors for providing the output signal.

5. A variable gain mixer according to claim 4 further comprising a bias generator which produces a bias signal which is added to the mixing input signal and an external gain control signal to produce the gain control input signal, whereby the transistors of the second differential pairs and the gain control transistors have the same bias voltage.

6. A variable gain mixer according to claim 2 further comprising:
    a bias generator which produces a bias signal which is added to the mixing input signal and an external gain control signal to produce the gain control input signal;
    a peak detection circuit which detects the peak voltage in the mixing input signal, adds this to the bias signal to produce a corrected bias signal, and adds the corrected bias signal to an external control voltage to produce the gain control input signal.

7. A variable gain mixer according to claim 6 further comprising a predistortion block connected to apply a predistortion function to the external control voltage.

8. A variable gain controlled mixer according to claim 1 wherein the first supply terminal is a positive supply terminal, the second supply terminal is a negative supply terminal, the mixer stage is comprised of NPN transistors, and the gain control transistors are PNP transistors.

9. A variable gain controlled mixer comprising:
    a mixer stage having differential mixing input terminals for receiving a mixing input signal, connected to a source of a main current, and having differential output terminals for producing a differential output signal, the output terminals also being connected across respective loads to a first supply terminal;
    a gain control transistor coupled between a second supply terminal and the source of the main current for receiving a gain control input signal;
    whereby the differential output signal is representative of the product of the main current, the mixing input signal, and the gain control input signal.

10. A variable gain controlled mixer according to claim 9 wherein the first supply terminal and the second supply terminal are one and the same positive supply terminal and the mixer stage is comprised of NPN transistors the gain control transistor is an NPN transistor.

11. A variable gain controlled mixer according to claim 10 further comprising an input stage for converting a main input signal into the main current.

12. A variable gain controlled mixer according to claim 11 wherein the input stage comprises an input bipolar transistor having a degeneration impedance coupled to its emitter and a first input terminal coupled to its base for supplying the main input signal thereto;
    the mixer stage comprises a differential pair of bipolar transistors having second input terminals coupled to their bases for supplying the mixing input signal to the differential pair of transistors, the transistors of the differential pair having emitters coupled to the transistor of the input stage, and the transistors of the differential pair having collectors for providing the output signal.

13. A variable gain mixer according to claim 10 further comprising a bias generator which produces a bias signal which is added to the mixing input signal and an external gain control signal to produce the gain control input signal, whereby the gain control transistor and the mixer stage transistors have the same bias voltage.

14. A variable gain mixer according to claim 10 further comprising:
    a bias generator which produces a bias signal which is added to the mixing input signal and an external gain control signal to produce the gain control input signal;
    a peak detection circuit which detects the peak voltage in the mixing input signal, adds this to the bias signal to produce a corrected bias signal, and adds the corrected bias signal to an external control voltage to produce the gain control input signal.

15. A variable gain mixer according to claim 10 further comprising a predistortion block connected to apply a predistortion function to the external control voltage.

16. A variable gain controlled mixer according to claim 9 wherein the first supply terminal is a positive supply terminal, the second supply terminal is a negative supply terminal, the mixer stage is comprised of NPN transistors, and the gain control transistor is a PNP transistor.

17. A variable gain controlled mixer comprising:

an input differential pair of transistors having emitters connected through a first current source to a negative supply terminal, and having collectors connected through respective second and third current sources to a positive supply terminal, and having input terminals for receiving a main differential input voltage across the bases of the input differential pair of transistors;

a mixer stage comprising first and second differential pairs of transistors of complementary type to the input differential pair, the emitters of each of the first and second differential pairs being connected to a respective collector of the input differential pair, the collectors of the first and second differential pairs being cross-connected with each other, one transistor of each of the first and second differential pairs being coupled to a respective terminal of a differential output terminal and through a load to the negative supply terminal;

first and second gain control transistors of complementary type to the input differential pair, each connected between the negative supply terminal and the emitters of a respective one of the first and second differential pairs, and having bases for receiving a gain control voltage;

whereby the differential output signal is representative of the product of the main differential input voltage, the mixing input signal, and the gain control input signal.

18. A variable gain mixer according to claim 17 further comprising a bias generator which produces a bias signal which is added to the mixing input signal and an external gain control signal to produce the gain control input signal, whereby the gain control transistors and the mixing transistors have the same bias voltage.

19. A variable gain mixer according to claim 17 further comprising:

a bias generator which produces a bias signal which is added to the mixing input signal and an external gain control signal to produce the gain control input signal;

a peak detection circuit which detects the peak voltage in the mixing input signal, adds this to the bias signal to produce a corrected bias signal, and adds the corrected bias signal to an external control voltage to produce the gain control input voltage.

20. A variable gain mixer according to claim 17 further comprising a predistortion block connected to apply a predistortion function to the external control voltage.

21. A variable gain controlled mixer comprising:

an input differential pair of transistors having emitters connected through a first current source to a negative supply terminal, and having collectors connected through respective second and third current sources to a positive supply terminal, and having input terminals for receiving a main differential input voltage across the bases of the input differential pair of transistors;

a mixer stage comprising first and second differential pairs of transistors of complementary type to the input differential pair, the emitters of each of the first and second differential pairs being connected to a respective collector of the input differential pair, the collectors of the first and second differential pairs being cross-connected with each other, one transistor of each of the first and second differential pairs being coupled to a respective terminal of a differential output terminal and through a load to the negative supply terminal;

first and second gain control transistors of the same type as the input differential pair, each connected between the positive supply terminal and a respective collector of a transistor of the input differential pair, and having bases for receiving a gain control voltage;

whereby the differential output signal is representative of the product of the main differential input voltage signal, the mixing input signal, and the gain control input signal.

* * * * *